United States Patent
Chang et al.

(10) Patent No.: US 10,366,978 B1
(45) Date of Patent: Jul. 30, 2019

(54) GROUNDED GATE NMOS TRANSISTOR HAVING SOURCE PULLED BACK REGION

(71) Applicant: UNITED MICROELECTRONICS CORP., Hsin-Chu (TW)

(72) Inventors: Chih-Hsiang Chang, Tainan (TW); Hou-Jen Chiu, Taichung (TW); Mei-Ling Chao, Tainan (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/036,914

(22) Filed: Jul. 16, 2018

(30) Foreign Application Priority Data

Jul. 6, 2018 (CN) .......................... 2018 1 0735223

(51) Int. Cl.
| | | |
|---|---|---|
| *H01L 27/02* | (2006.01) | |
| *H01L 29/10* | (2006.01) | |
| *H01L 29/423* | (2006.01) | |
| *H01L 29/45* | (2006.01) | |
| *H01L 29/06* | (2006.01) | |
| *H01L 29/78* | (2006.01) | |
| *H01L 29/08* | (2006.01) | |

(52) U.S. Cl.
CPC ...... *H01L 27/0277* (2013.01); *H01L 29/0653* (2013.01); *H01L 29/0692* (2013.01); *H01L 29/0847* (2013.01); *H01L 29/1095* (2013.01); *H01L 29/42376* (2013.01); *H01L 29/456* (2013.01); *H01L 29/7835* (2013.01)

(58) Field of Classification Search
None
See application file for complete search history.

(56) References Cited

U.S. PATENT DOCUMENTS

| | | | |
|---|---|---|---|
| 7,525,150 B2 | 4/2009 | Chen | |
| RE43,215 E * | 2/2012 | Ker ..................... | H01L 27/0277 257/355 |
| 8,648,421 B2 | 2/2014 | Wen | |
| 2005/0082619 A1* | 4/2005 | Wu ..................... | H01L 27/0266 257/361 |
| 2011/0079846 A1* | 4/2011 | Yao ....................... | H01L 29/402 257/335 |

(Continued)

*Primary Examiner* — Bilkis Jahan
(74) *Attorney, Agent, or Firm* — Winston Hsu

(57) ABSTRACT

A grounded gate NMOS transistor includes a P-type substrate, P-well region in the P-type substrate, and a gate finger traversing the P-well region. The gate finger has a first spacer on a first sidewall and a second spacer on a second sidewall opposite to the first sidewall. An $N^+$ drain doping region is disposed in the P-type substrate and is adjacent to the first sidewall of the gate finger. The $N^+$ drain doping region is contiguous with a bottom edge of the first spacer. An $N^+$ source doping region is disposed in the P-type substrate opposite to the $N^+$ drain doping region. The $N^+$ source doping region is kept a predetermined distance from a bottom edge of the second spacer. A $P^+$ pick-up ring is disposed in the P-well region and surrounds the gate finger, the $N^+$ drain doping region, and the $N^+$ source doping region.

8 Claims, 2 Drawing Sheets

(56) References Cited

U.S. PATENT DOCUMENTS

| | | | |
|---|---|---|---|
| 2011/0133279 A1* | 6/2011 | Cha | H01L 29/0847 257/343 |
| 2011/0156142 A1* | 6/2011 | Teo | H01L 29/0646 257/336 |
| 2015/0102427 A1* | 4/2015 | Chen | H01L 29/402 257/409 |

* cited by examiner

US 10,366,978 B1

GROUNDED GATE NMOS TRANSISTOR HAVING SOURCE PULLED BACK REGION

BACKGROUND OF THE INVENTION

1. Field of the Invention

The present invention relates to a semiconductor device, and more particularly to a semiconductor device having an electrostatic discharge protection function.

2. Description of the Prior Art

Electrostatic discharge (ESD) phenomena in integrated circuits (ICs) are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

One common scheme to protect an input/output (I/O) pad against ESD failure uses metal-oxide-semiconductor components, such as NMOS transistor with its drain connected to the pin to be protected and its source tied to ground, and relies on the mode of a parasitic bipolar transistor (the source acts as the emitter, the drain as the collector, and the bulk semiconductor as the base) during an ESD event to provide a low impedance current path to ground. The protection level or failure threshold can be set by varying the NMOS device width.

As ESD protection, snapback-based solutions need to have a trigger voltage that is higher than the supply voltage of the chip they are protecting. However, in some applications, noise spikes and system level events are a common occurrence. If the difference between the chip's supply voltage and the snapback-based solution's trigger voltage is not high enough, these events can trigger the ESD protection. If the snapback voltage, and thus the holding voltage, is below the supply voltage, latch-up can occur.

SUMMARY OF THE INVENTION

One object of the present invention is to provide a semiconductor device having a higher holding voltage and is able to provide an electrostatic discharge protection function.

According to one embodiment of the invention, a grounded gate NMOS transistor includes a P-type substrate, P-well region in the P-type substrate, and a gate finger traversing the P-well region. The gate finger has a first spacer on a first sidewall and a second spacer on a second sidewall opposite to the first sidewall. An $N^+$ drain doping region is disposed in the P-type substrate and is adjacent to the first sidewall of the gate finger. The $N^+$ drain doping region is contiguous with a bottom edge of the first spacer. An $N^+$ source doping region is disposed in the P-type substrate opposite to the $N^+$ drain doping region. The $N^+$ source doping region is kept a predetermined distance from a bottom edge of the second spacer. A $P^+$ pick-up ring is disposed in the P-well region and surrounds the gate finger, the $N^+$ drain doping region, and the $N^+$ source doping region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Figure 1:
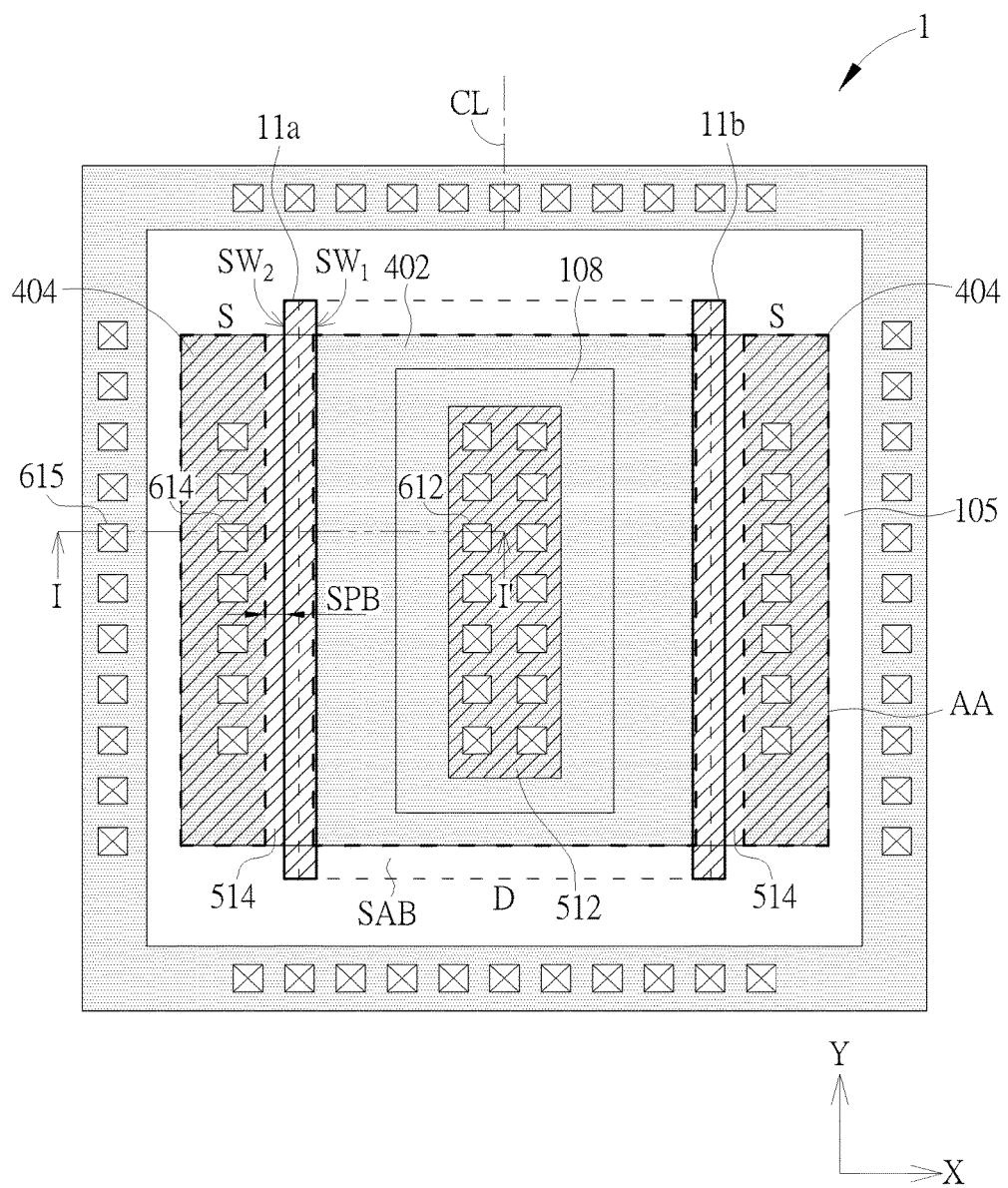
FIG. 1 is a schematic layout diagram of a grounded gate N-type metal-oxide-semiconductor (NMOS) transistor according to an embodiment of the invention.
Figure 2:
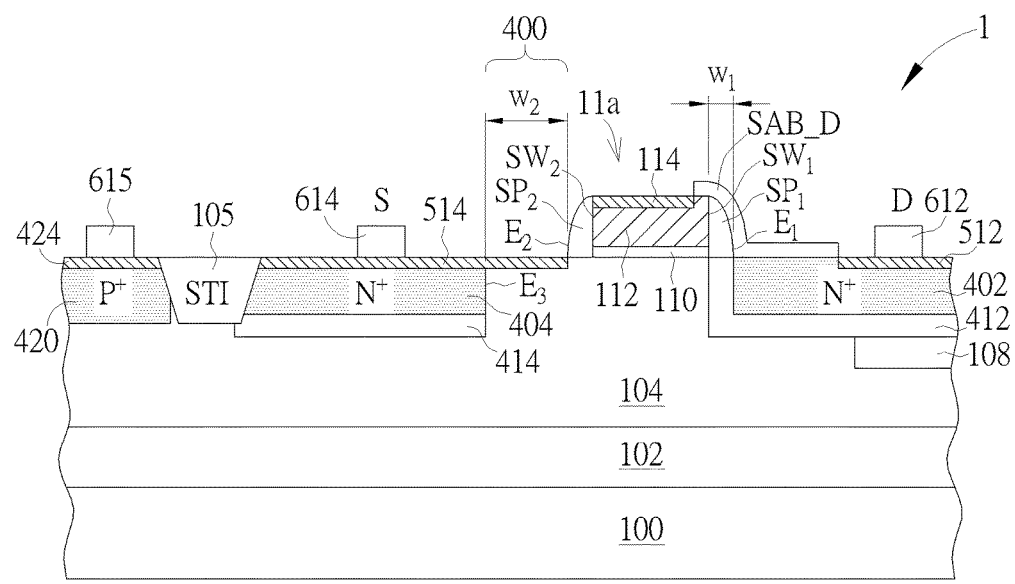
FIG. 2 is a schematic cross-sectional view taken along line I-I' in FIG. 1.

Please refer to FIG. 1 and FIG. 2. FIG. 1 is a schematic layout diagram of a grounded gate N-type metal-oxide-semiconductor (NMOS) transistor according to an embodiment of the invention. FIG. 2 shows a schematic cross-sectional view taken along line I-I' in FIG. 1.

It can be seen from FIG. 1 that the grounded gate NMOS transistor exhibits a left-right symmetric layout structure with respect to the central line CL. For the sake of simplicity, FIG. 2 only shows the cross-sectional structure of the left half of the grounded gate NMOS transistor.

As shown in FIG. 1 and FIG. 2, an embodiment of the present invention provides a grounded gate NMOS transistor 1 comprising a P-type substrate 100, such as a P-type silicon substrate, but is not limited thereto. The P-type substrate 100 is provided with an active area AA surrounded by an annular and continuous trench isolation region 105. In the P-type substrate 100, a P-well region 104 is provided. Under the P-well region 104, a deep N-well 102 may be disposed.

According to an embodiment of the present invention, as shown in FIG. 1, above the P-well region 104, along the reference y-axis direction, two approximately parallel gate fingers 11a, 11b are disposed across the active area AA and the P-well region 104. The two parallel gate fingers 11a, 11b divide the active area AA into an intermediate drain region D and two source regions S on both sides. According to an embodiment of the invention, the distal ends of each of the gate fingers 11a, 11b may extend onto the trench isolation region 105. It should be noted that the number of gate fingers can be determined according to design requirements. The number of gate fingers is not limited to the layout shown in the figures.

According to an embodiment of the invention, each of the gate fingers 11a, 11b may include a gate conductive layer 112, such as polysilicon or metal, but is not limited thereto. A gate dielectric layer 110 may be disposed between the gate conductive layer 112 and the P-type substrate 100. The gate dielectric layer 110 may comprise silicon oxide, but not limited thereto.

According to the embodiment of the present invention, a first spacer $SP_1$ is disposed on a first spacer $SW_1$ of each of the gate fingers 11a and 11b, and a second spacer $SP_2$ is disposed on a second sidewall $SW_2$ opposite to the first sidewall $SW_1$. As shown in FIG. 2, the first sidewall $SW_1$ is on the same side as the drain region D, and the second sidewall $SW_2$ is on the same side as the source region S. For example, the first spacer $SP_1$ and the second spacer $SP_2$ may include silicon nitride or silicon oxide, but not limited thereto. According to an embodiment of the invention, the bottom width $w_1$ of the first spacer $SP_1$ and the second spacer $SP_2$ is about 20 nm.

According to an embodiment of the invention, an $N^+$ drain doping region 402 is provided in the P-well region 104 within the active area AA. The $N^+$ drain doping region 402 of the drain region D is adjacent to the first sidewall $SW_1$ of the gate finger 11a. According to an embodiment of the invention, the $N^+$ drain doping region 402 is contiguous with a bottom edge $E_1$ of the first spacer $SP_1$. In addition, in the P-well region 104, a drain-side lightly doped drain (NLDD) region 412 may be disposed around the $N^+$ drain doping region 402. According to an embodiment of the present invention, an edge of the drain-side NLDD region 412 may extend directly below the first spacer $SP_1$ and may partially overlap the first spacer $SP_1$.

According to an embodiment of the invention, a P-type ESD (PESD) doped region 108 may be formed in the P-well region 104 below the $N^+$ drain doping region 402 and the drain-side NLDD region 412.

According to an embodiment of the invention, an $N^+$ source doping region 404 is disposed in the P-well region 104, which is opposite to the $N^+$ drain doping region 402. The $N^+$ source doping region 404 of the source region S is kept a predetermined distance $w_2$ from a bottom edge $E_2$ of the second spacer $SP_2$. The predetermined distance $w_2$ is not less than 200 nm, for example, about 300 nm. In the P-well region 104, a source-side NLDD region 414 may be provided around the $N^+$ source doping region 404. According to an embodiment of the invention, the source-side NLDD region 414 and the $N^+$ source doping region 404 may have an aligned edge $E_3$, wherein the region between the aligned edge $E_3$ and the bottom edge $E_2$ of the second spacer $SP_2$ is a source pulled back (SPB) region 400.

An annular and continuous $P^+$ pick-up ring 420 is disposed in the P-type substrate 100 along the periphery of the trench isolation region 105. The $P^+$ pick-up ring 420 can be disposed in P-well region 104 and surround the gate fingers 11a, 11b, the drain region D (including the $N^+$ drain doping region 402), and the source region S (including the $N^+$ source doping regions 404).

According to an embodiment of the invention, a metal silicide layer 512, such as cobalt silicide or nickel silicide, is disposed on the drain region D. According to an embodiment of the invention, a metal silicide block layer SAB_D may be disposed on the drain region D such that the metal silicide layer 512 is only partially formed on the $N^+$ drain doping region 402 in a region not covered by the metal silicide block layer SAB_D. The metal silicide block layer SAB_D may extend onto the first spacer $SP_1$.

According to an embodiment of the invention, the source region S is provided with a metal silicide layer 514, such as cobalt silicide or nickel silicide. According to an embodiment of the invention, the metal silicide layer 514 may be formed on the entire top surface of the $N^+$ source doping region 404 and may be in contact with the bottom edge $E_2$ of the second spacer $SP_2$.

Figure 3:
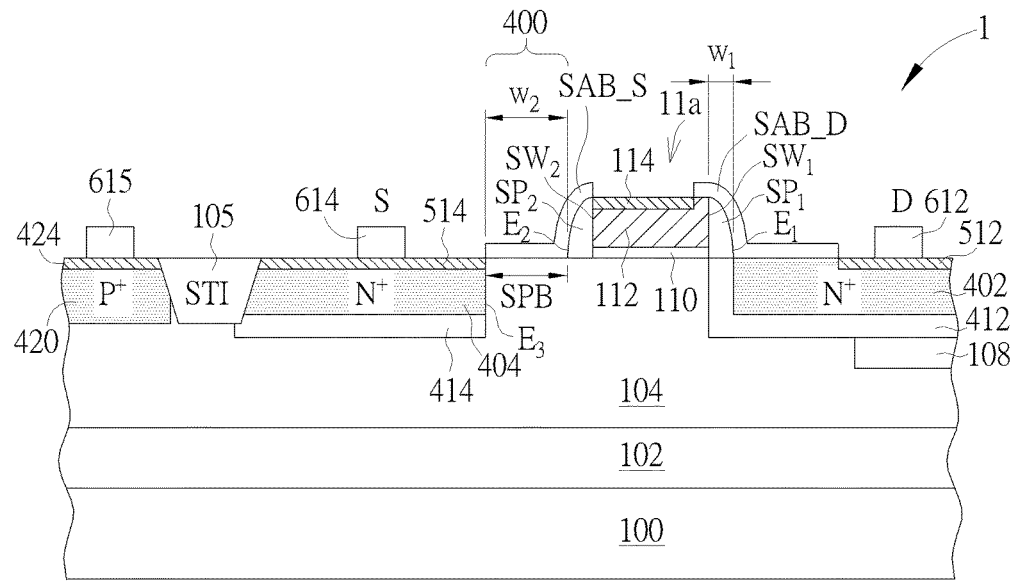
FIG. 3 is a cross-sectional view showing a grounded gate N-type metal-oxide-semiconductor (MOS) transistor according to another embodiment of the present invention.

According to another embodiment of the present invention, as shown in FIG. 3, the metal silicide layer 514 may be formed only on a portion of the top surface of the $N^+$ source doping region 404 and not contact the bottom edge $E_2$ of the second spacer $SP_2$. In the example of FIG. 3, a metal silicide block layer SAB_S may be additionally disposed on the source region S such that the metal silicide layer 514 is only partially formed on a region of the $N^+$ source doping region 404 that is not covered by the metal silicide block layer SAB_S. For example, the SPB region 400 described above is covered by the metal silicide block layer SAB_S, so that no metal silicide layer is formed in the SPB region 400. The metal silicide block layer SAB_S may extend onto the second spacer $SP_2$.

According to an embodiment of the invention, a metal silicide layer 114 and a metal silicide layer 424, such as cobalt silicide or nickel silicide, may be disposed on each of the gate fingers 11a, 11b and the $P^+$ pick-up ring 420, respectively. According to an embodiment of the present invention, the metal silicide layer 424, the metal silicide layer 114, the metal silicide layer 512, and the metal silicide layer 514 may be formed in the same metal silicidation process. In addition, a contact structure 612 may be disposed on the metal silicide layer 512 of the drain region D, and a contact structure 614 may be disposed on the metal silicide layer 514 of the source region S, and a contact structure 615 may be disposed on the metal silicide layer 424 of the $P^+$ pick-up ring 420.

Compared with the conventional grounded gate NMOS transistor, the grounded gate NMOS transistor 1 of the present invention has a SPB region, so that the range of the base region of the parasitic bipolar transistor generated during operation is increased, and the range of the emitter region is decreased, and therefore the holding voltage can be raised. For example, based on the results of the verification, for a 6V grounded gate NMOS transistor, the holding voltage can be raised from the original 6.6V to about 7.7V.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A grounded gate NMOS transistor, comprising:
a P-type substrate;
a P-well region in the P-type substrate;
a gate finger traversing the P-well region, wherein the gate finger has a first spacer on a first sidewall and a second spacer on a second sidewall opposite to the first sidewall;
an $N^+$ drain doping region in the P-type substrate and adjacent to the first sidewall of the gate finger, wherein the $N^+$ drain doping region is contiguous with a bottom edge of the first spacer;
an $N^+$ source doping region in the P-type substrate opposite to the $N^+$ drain doping region, wherein the $N^+$ source doping region is kept a predetermined distance from a bottom edge of the second spacer, so that the $N^+$ source doping region is not contiguous with a bottom edge of the second spacer, and a source pulled back (SPB) region is defined between edge of the $N^+$ source doping region and the bottom edge of the second spacer; and
a $P^+$ pick-up ring in the P-well region and surrounding the gate finger, the $N^+$ drain doping region, and the $N^+$ source doping region.

2. The grounded gate NMOS transistor according to claim 1, wherein the predetermined distance is not less than 200 nm.

3. The grounded gate NMOS transistor according to claim 1, wherein the predetermined distance is about 300 nm.

4. The grounded gate NMOS transistor according to claim 1 further comprising:
   a drain-side N-type lightly doped drain (NLDD) region disposed directly under the N$^+$ drain doping region; and
   a source-side N-type lightly doped drain (NLDD) region disposed directly under the N$^+$ source doping region.

5. The grounded gate NMOS transistor according to claim 4, wherein the source-side NLDD region and the N$^+$ source doping region have an aligned edge.

6. The grounded gate NMOS transistor according to claim 1, wherein no silicide layer is disposed within the SPB region.

7. The grounded gate NMOS transistor according to claim 1 further comprising:
   a deep N well underneath the P-well region.

8. The grounded gate NMOS transistor according to claim 1 further comprising:
   a trench isolation region between the P$^+$ pick-up ring and the N$^+$ drain doping region and the N$^+$ source doping region.

\* \* \* \* \*